(12) United States Patent
Fuller et al.

(10) Patent No.: US 8,367,556 B1
(45) Date of Patent: Feb. 5, 2013

(54) USE OF AN ORGANIC PLANARIZING MASK FOR CUTTING A PLURALITY OF GATE LINES

(75) Inventors: Nicholas C. M. Fuller, North Hills, NY (US); Pratik P. Joshi, Cliffside Park, NJ (US); Mahmoud Khojasteh, Poughkeepsie, NY (US); Rajiv M. Ranade, Brewster, NY (US); George G. Totir, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/309,174

(22) Filed: Dec. 1, 2011

(51) Int. Cl.
*H01L 21/302* (2006.01)
*H01L 21/461* (2006.01)

(52) U.S. Cl. ........... 438/749; 257/E21.005; 257/E21.27; 257/E23.03; 257/E51.038; 438/689; 438/745; 438/778; 438/780; 438/781; 438/782

(58) Field of Classification Search ........... 257/E21.005, 257/E21.27, E23.03, E51.038; 438/689, 438/745, 749, 778, 780–782
See application file for complete search history.

(56) References Cited

U.S. PATENT DOCUMENTS

| 2011/0111596 A1* | 5/2011 | Kanakasabapathy | ......... 438/694 |
| 2012/0038056 A1* | 2/2012 | Cabral et al. | .................. 257/774 |

* cited by examiner

*Primary Examiner* — Asok K Sarkar
(74) *Attorney, Agent, or Firm* — Scully, Scott, Murphy & Presser, P.C.; Louis J. Percello, Esq.

(57) ABSTRACT

An organic planarizing layer (OPL) is formed atop a semiconductor substrate which includes a plurality of gate lines thereon. Each gate line includes at least a high k gate dielectric and a metal gate. A patterned photoresist having at least one pattern formed therein is then positioned atop the OPL. The at least one pattern in the photoresist is perpendicular to each of the gate lines. The pattern is then transferred by etching into the OPL and portions of each of the underlying gate lines to provide a plurality of gate stacks each including at least a high k gate dielectric portion and a metal gate portion. The patterned photoresist and the remaining OPL layer are then removed utilizing a sequence of steps including first contacting with a first acid, second contacting with an aqueous cerium-containing solution, and third contacting with a second acid.

23 Claims, 10 Drawing Sheets

USE OF AN ORGANIC PLANARIZING MASK FOR CUTTING A PLURALITY OF GATE LINES

BACKGROUND

The present disclosure relates to semiconductor device manufacturing, and more particularly, to a process for cutting a plurality of gate lines into a plurality of gate stacks.

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and circuitry.

Continuing trends in semiconductor device manufacturing include a reduction in electrical device feature size (scaling), as well as improvements in device performance in terms of device switching speed and power consumption. Recent MOS and CMOS transistor scaling efforts have focused on high k materials having dielectric constants greater than that of silicon oxide (e.g., greater than about 3.9), which can be formed in a thicker layer than scaled silicon oxide, and yet which produce equivalent field effect performance. Another type of CMOS device that is available is one where the gate electrode includes at least a metal gate layer.

In the manufacturing of such devices, a plurality of gate lines including at least a high k gate dielectric and an overlying metal gate are formed on a surface of a semiconductor substrate. Each gate line of the plurality of gate lines can be cut into a plurality of gate stacks that can be used to manufacture field effect transistor devices. In the cutting of gate lines, a stack including at least a photoresist is typically formed on the substrate and atop the plurality of gate lines. At least one pattern is then formed through the stack that exposes an uppermost portion of each gate line. An etching process is used to transfer the at least one pattern to the underlying gate lines. During etching, each underlying gate line is cut into a plurality of gate stacks. After etching, the patterned stack needs to be removed. In conventional processes, a mixture of sulfuric acid and peroxide is used to remove the patterned stack from atop the substrate. Such a mixture not only removes the patterned stack, but can also attack a portion of the metal gate of each gate stack. For example, a mixture of sulfuric acid and peroxide can result in providing gate stacks that have an undercut metal gate. Alternatively, a mixture of sulfuric acid and peroxide can result in material loss of each gate stack if the gate stacks are exposed. Alternatively, the use of a mixture of sulfuric acid and peroxide can result in complete lift off of the gate stacks.

In view of the above, there is a continued for providing an improved method for cutting a plurality of gate lines into gate stacks which avoids the drawbacks associated with prior art methods in which a mixture of sulfuric acid and peroxide are used to remove the pattered stack from the structure.

SUMMARY

An organic planarizing layer (OPL) is formed atop a semiconductor substrate which includes a plurality of gate lines located thereon. Each gate line of the plurality of gate lines includes at least a high k gate dielectric and a metal gate. A patterned photoresist having at least one pattern formed therein is then positioned atop the OPL. At least one pattern in the photoresist is perpendicular to each of the gate lines. The pattern is then transferred by etching into the OPL and portions of each of the underlying gate lines to provide a plurality of gate stacks each including at least a high k gate dielectric portion and a metal gate portion. The patterned resist and the remaining OPL layer are then removed without negatively affecting any of the metal gate portions of each of the gate stacks utilizing a sequence of steps including first contacting with a first acid, second contacting with an aqueous cerium-containing solution, and third contacting with a second acid.

In one embodiment of the present disclosure, a process for forming a semiconductor structure is provided. The process includes first forming a plurality of gate lines on a surface of a semiconductor substrate. Each gate line includes at least a high k gate dielectric and an overlying metal gate. An organic planarizing layer (OPL) is then formed atop the semiconductor substrate and the plurality of gate lines. A patterned photoresist including at least one pattern is then formed. The at least one pattern is located atop a portion of each gate line of the plurality of gate lines. The at least one pattern is then transferred into the underlying OPL and each gate line. The patterned photoresist and the remaining portions of the OPL layer are completely removed by (a) first contacting the structure with a first acid at a first temperature and for a first period of time, (b) second contacting the structure with an aqueous cerium-containing solution at a second temperature and for a second period of time, and (c) third contacting the structure with a second acid at a third temperature and for a third period of time. Contacting steps (b) and (c) can be repeated as deemed necessary.

In another embodiment, a process is provided that includes forming a plurality of gate lines on a surface of a semiconductor substrate. Each gate line of the plurality of gate lines includes at least a high k gate dielectric and an overlying metal gate. An organic planarizing layer (OPL) is then formed atop the semiconductor substrate and the plurality of gate lines. A patterned photoresist including at least one pattern is formed atop the OPL. The at least one pattern is located atop a portion of each gate line of the plurality of gate lines. The at least one pattern is the transferred into the underlying OPL and each gate line by etching. Next, the patterned photoresist and remaining OPL layer are removed by a sequence of contacting steps comprising (a) first contacting with sulfuric acid, (b) second contacting with an aqueous solution comprising a cerium (IV) containing complex or salt and at least one ammonium salt or complex, and (c) third contacting with sulfuric acid.

DETAILED DESCRIPTION

The present disclosure, which relates to a process for cutting gate lines including at least a high k gate dielectric and an overlying metal gate into gate stacks including at least a high k gate dielectric portion and an overlying metal gate portion, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
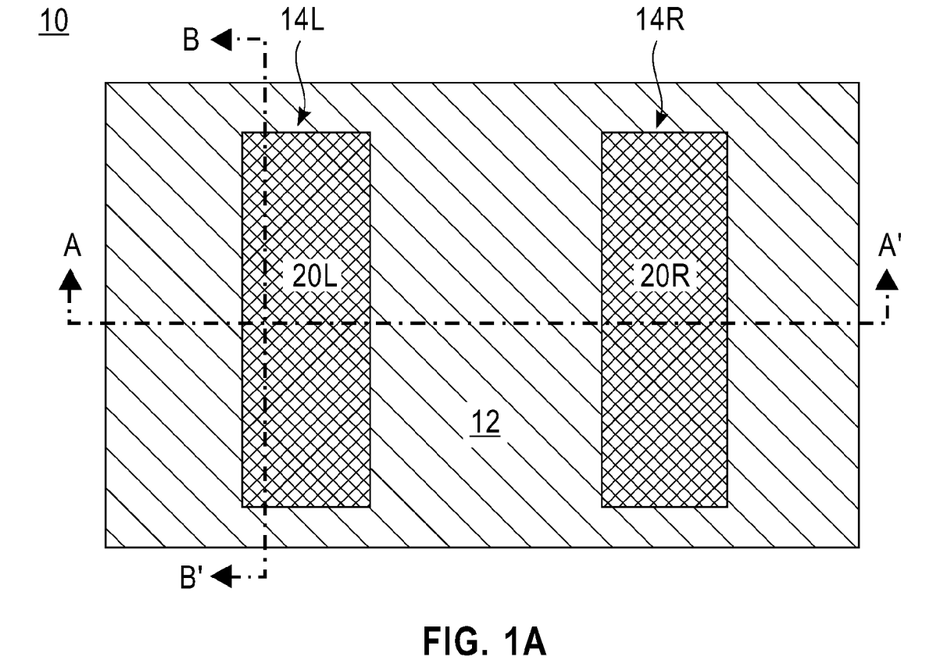
FIG. 1A is a pictorial representation (through a top-down view) illustrating an initial structure including a semiconductor substrate having a plurality of gate lines located thereon.
Figure 1B:
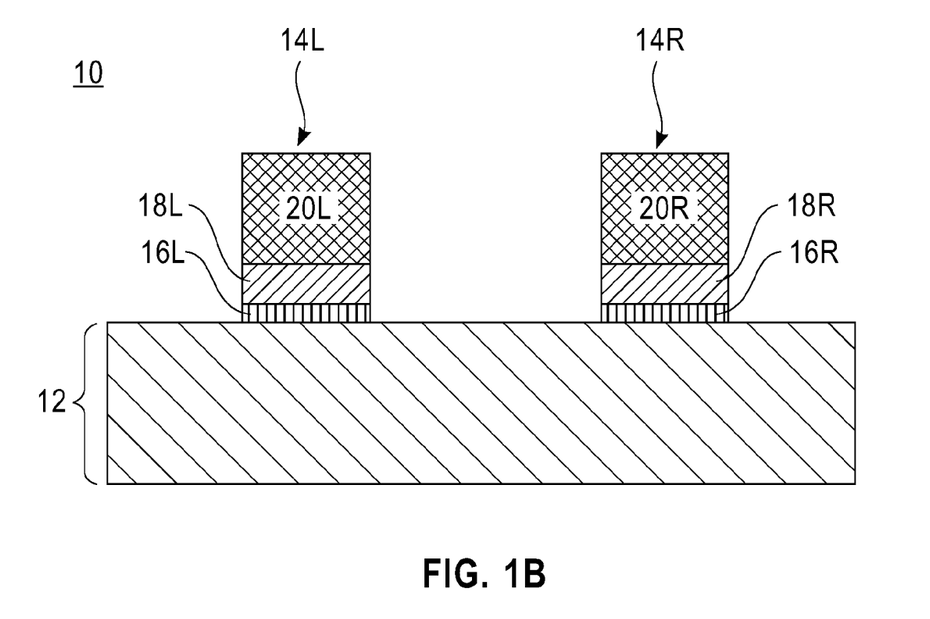
FIG. 1B is a cross sectional view of the initial structure along cut A-A' shown in FIG. 1A.
Figure 1C:
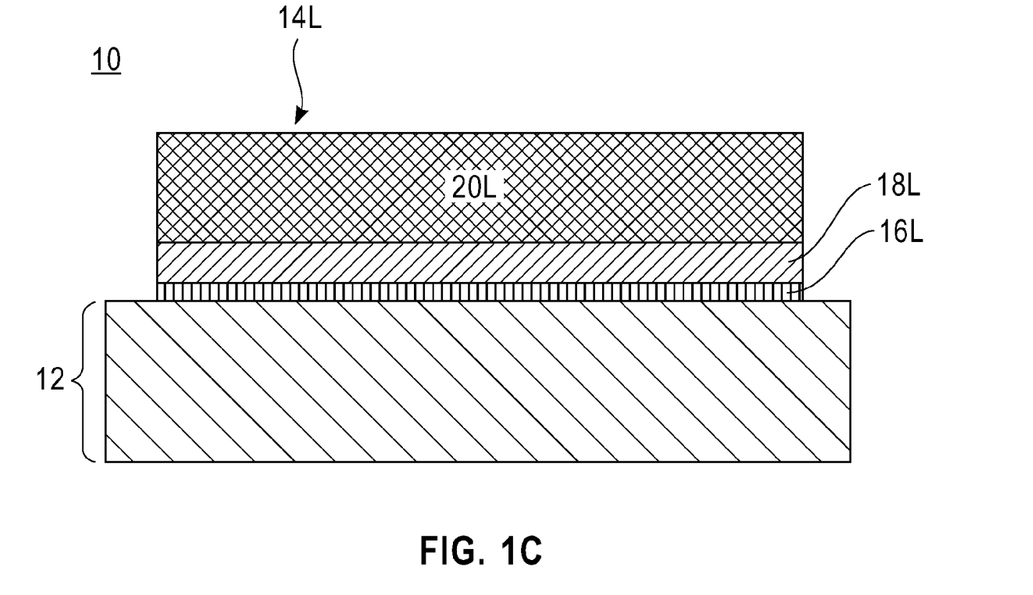
FIG. 1C is a cross sectional view of the initial structure along cut B-B' shown in FIG. 1A.

Reference is now made to FIGS. 1A, 1B and 1C which illustrate an initial structure 10 that can be employed in the present disclosure. The initial structure 10 includes a semiconductor substrate 12 having a plurality of gate lines (14L and 14R) located on a surface of the semiconductor substrate 12. Each gate line 14L and 14R of the plurality of gate lines are oriented parallel to one another. Each gate line 14L and 14R includes at least a high k gate dielectric 16L, 16R and a metal gate 18L, 18R. Each gate line 14L and 14R may optionally include a Si-containing gate electrode 20L, 20R atop each metal gate 18L, 18R.

The semiconductor substrate 12 includes any semiconductor material including, but not limited to Si, SiGe, SiGeC, SiC, Ge alloys, GaAs, InAs, InP and other III/V or II/VI compound semiconductors. In addition to these listed types of semiconductor materials, the semiconductor substrate 12 can also be a layered semiconductor such as, for example, Si/SiGe, Si/SiC, silicon-on-insulators (SOIs) or silicon germanium-on-insulators (SGOIs). In some embodiments, the semiconductor substrate 12 is a Si-containing semiconductor material, i.e., a semiconductor material that includes silicon. The semiconductor substrate 12 may include a single crystal orientation or it may include at least two coplanar surface regions that have different crystal orientations (the latter substrate is referred to in the art as a hybrid substrate). For illustrative purposes the semiconductor substrate 12 is comprised of a bulk semiconductor. By "bulk" it is meant that the entirety of the substrate is composed of a semiconductor material.

The semiconductor substrate 12 may also include a doped (n- or p-) region. For clarity, the doped region is not specifically shown in any of the drawings of the present application. The doped region is known as a "well" and the well can be formed utilizing conventional ion implantation processes that are known to those skilled in the art.

At least one isolation region (not shown) can be formed into the semiconductor substrate 12. The at least one isolation region may be a trench isolation region or a field oxide isolation region. The trench isolation region is formed utilizing a trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. As known to those skilled in the art, the at least one isolation region provides isolation between neighboring devices, typically required when the neighboring devices have opposite conductivities, i.e., nFETs and pFETs. The portion of the semiconductor substrate 12 that is located between neighboring isolation regions is referred to herein as the 'active area' of the semiconductor substrate 12. The active area of the semiconductor substrate is the area in which semiconductor devices, such as transistors, can be formed.

Each high k gate dielectric 16L and 16R of each gate line 14L and 14R includes a dielectric metal oxide having a dielectric constant that is greater than the dielectric constant of silicon oxide, e.g., 3.9. Typically, each high k gate dielectric 16L and 16R that can be employed in the present disclosure has a dielectric constant greater than 4.0, with a dielectric constant of greater than 8.0 being even more typical. Exemplary high k dielectric materials that can be employed in the present disclosure include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned high k dielectric materials can be employed. In some embodiments, high k gate dielectric 16L is comprised of a same high k gate dielectric as high k gate dielectric 16R. In other embodiments, high k gate dielectric 16L is comprised of a different high k gate dielectric as high k gate dielectric 16R. When different high k gate dielectric materials are employed, block mask technology can be used to form different type high k gate dielectric materials.

In one embodiment, each high k gate dielectric 16L and 16R of each gate line 14L and 14R can be formed atop an interfacial layer (not shown) that is formed atop the semiconductor substrate 12 prior to forming each high k gate dielectric 16L and 16R of each gate line 14L and 14R. In such an embodiment, the interfacial layer can be composed of a semiconductor oxide, semiconductor nitride and/or semiconductor oxynitride. Such interfacial materials can be formed utilizing a thermal process such as, for example, thermal oxide and/or thermal nitridation.

The thickness of each high k gate dielectric 16L and 16R of each gate line 14L and 14R may vary depending on the technique used to form the same. Typically, however, each high k gate dielectric 16L and 16R of each gate line 14L and 14R has a thickness from 0.5 nm to 10 nm, with a thickness from 1.0 nm to 5 nm being more typical. In some embodiments of the present disclosure, each high k gate dielectric 16L and 16R of each gate line 14L and 14R employed may have an effective oxide thickness on the order of, or less than, 2 nm.

Each high k gate dielectric 16L and 16R of each gate line 14L and 14R can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Each metal gate 18L and 18R of each gate line 14L and 14R comprises any conductive metal-containing material including, but not limited to an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, each metal gate 18L and 18R of each gate line 14L and 14R is comprised of an nFET metal. In another embodiment, each metal gate 18L and 18R is comprised of a pFET metal. In a further embodiment, each metal gate 18L and 18R of each gate line 14L and 14R is comprised of TiN. In some embodiments, metal gate 18L is comprised of a different metal gate material as compared with metal gate 18R. In such an embodiment, block mask technology can be used to form different metal gate materials for material gate 18L and metal gate 18R.

Each metal gate 18L and 18R of each gate line 14L and 14R can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When a metal silicide is formed, a conventional silicidation process can be employed.

In some embodiments, each gate line 14L and 14R of the plurality of gate lines includes a Si-containing gate electrode 20L and 20R atop each metal gate 18L and 18R. Each Si-containing gate electrode 20L and 20R includes doped polysilicon, doped SiGe and combinations thereof. Each Si-containing gate electrode 20L and 20R can be formed by first forming a non-doped Si-containing layer atop each metal gate 18L and 18R and thereafter introducing a dopant into the non-doped Si-containing layer by utilizing one of ion implantation, gas phase doping, or by transferring a dopant from a sacrificial material layer formed in proximity of the non-doped Si-containing layer, and then removing the sacrificial layer from the structure. Alternatively, a doped Si-containing layer can be formed utilizing an in-situ doping deposition process.

In some embodiments, each material layer of each gate line 14L and 14R is formed as a blanket layer and thereafter a patterning process is used in forming each gate line 14L and 14R. The patterning process includes lithography (applying a photoresist atop the uppermost surface of the blanket material layer, exposing the photoresist to radiation and developing the exposed resist using a conventional developer). The lithography step provides a patterned photoresist atop the uppermost blanket material layer of the gate line. An etching step is then used to transfer the pattern from the patterned photoresist into the underlying blanket layers of gate dielectric 16L and 16R, metal gate 18R and 18L and optional Si-containing gate electrode 20L and 20R. The etching may include a dry etching process such as, for example, reactive ion etching, plasma etching, ion etching or laser ablation. The etching may further include a wet chemical etching process in which one or more chemical etchants are used to remove portions of the blanket layers that are not protected by the patterned photoresist. The patterned photoresist can be removed utilizing an ashing process.

Figure 2A:
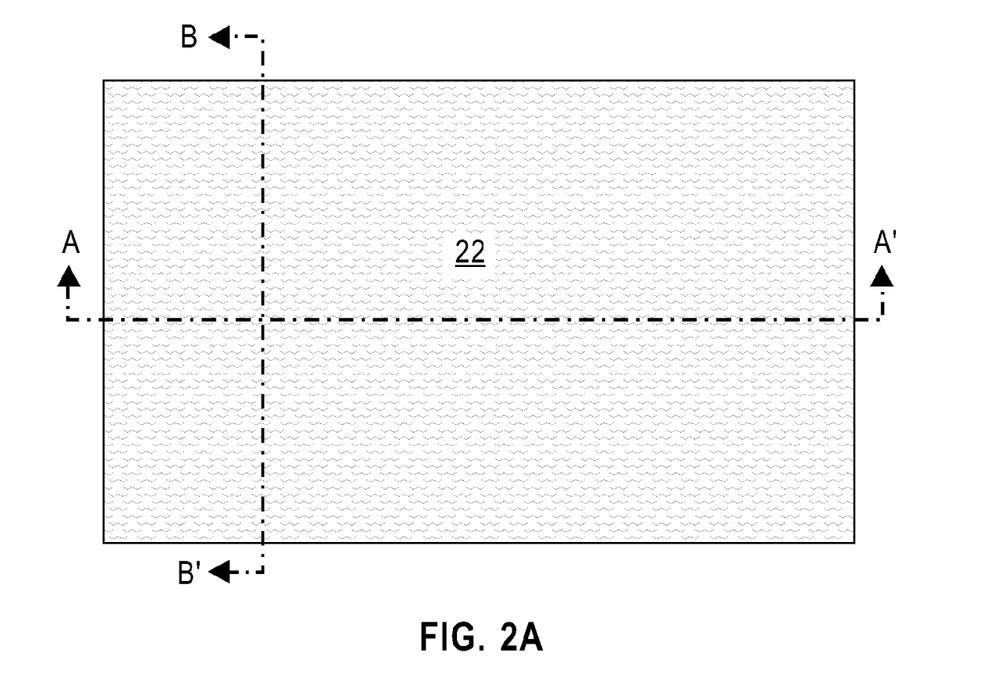
FIG. 2A is a pictorial representation (through a top-down view) illustrating the initial structure of FIG. 1A after forming an organic planarizing layer.
Figure 2B:
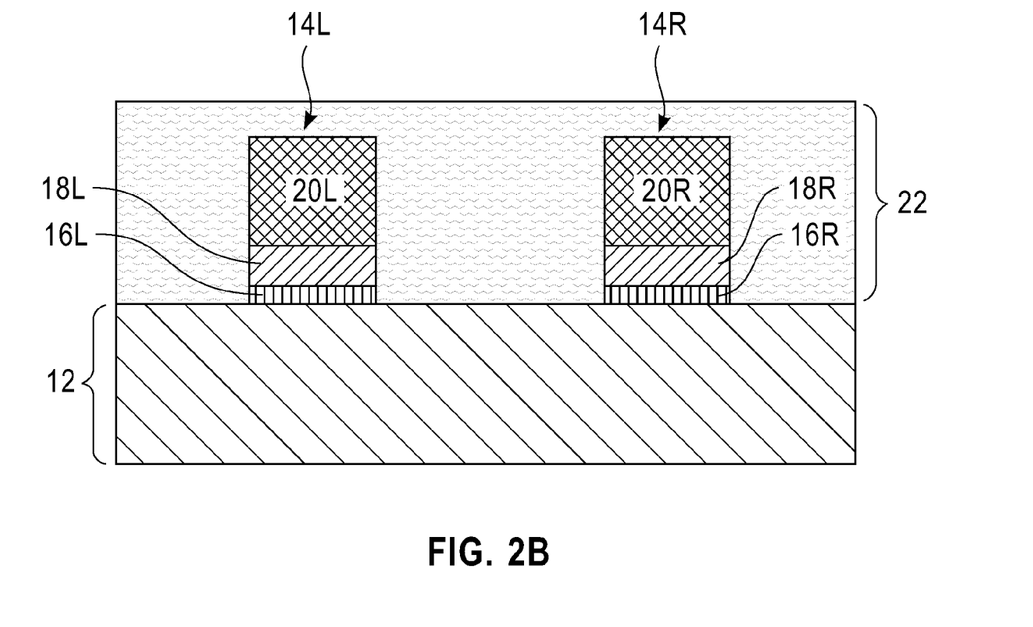
FIG. 2B is a cross sectional view of the structure along cut A-A' shown in FIG. 2A.
Figure 2C:
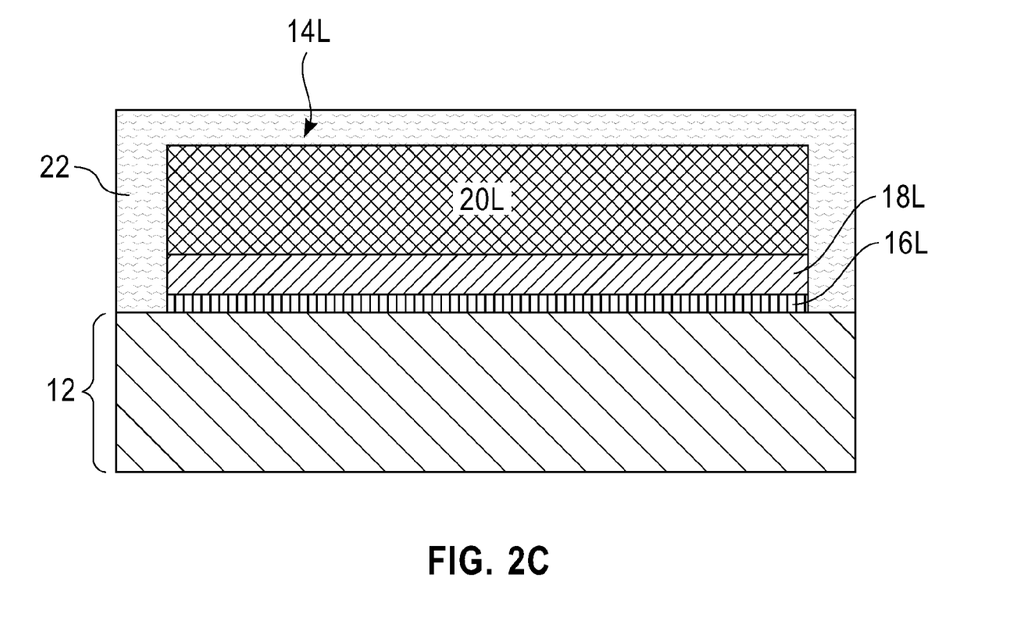
FIG. 2C is a cross sectional view of the structure along cut B-B' shown in FIG. 2A.

Referring now to FIGS. 2A, 2B and 2C, there are illustrated the structure of FIGS. 1A, 1B and 1C, respectively, after forming an organic planarizing layer (OPL) 22 atop the semiconductor substrate 12 and around each gate line 14L and 14R of the plurality of gate lines. As is illustrated, a portion of the OPL layer 22 directly contacts each gate line 14L and 14R of the plurality of gate lines.

The OPL 22 that is employed in the present disclosure comprising any organic material including, but not limited to, a near-frictionless carbon (NFC) material, and a polyimide.

The OPL 22 can be formed utilizing a deposition process such as, for example, spin-on, CVD, PECVD, evaporation, chemical solution deposition and other like deposition techniques. Chemical mechanical planarization (CMP) and/or grinding can be used to planarize the deposited OPL 22.

The thickness of the OPL 22 can vary so long as its thickness is greater than the total thickness of each gate line 14L and 14R of the plurality of gate lines. In one embodiment, the OPL 22 has a thickness from 50 nm to 500 nm. In another embodiment, the OPL 22 has a thickness from 150 nm to 300 nm.

Figure 3A:
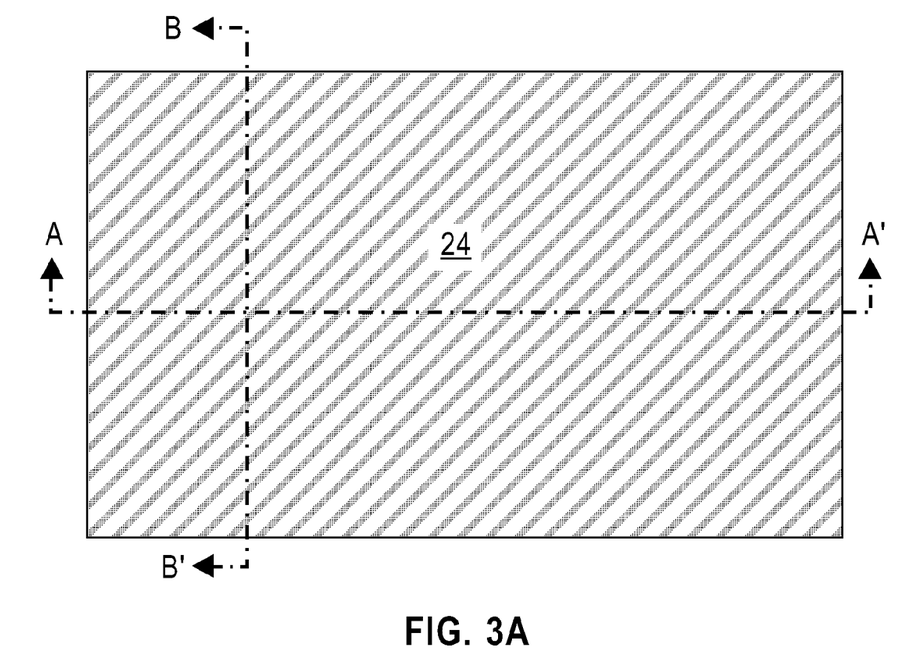
FIG. 3A is a pictorial representation (through a top-down view) illustrating the structure of FIG. 2A after forming a photoresist atop the organic planarizing layer.
Figure 3B:
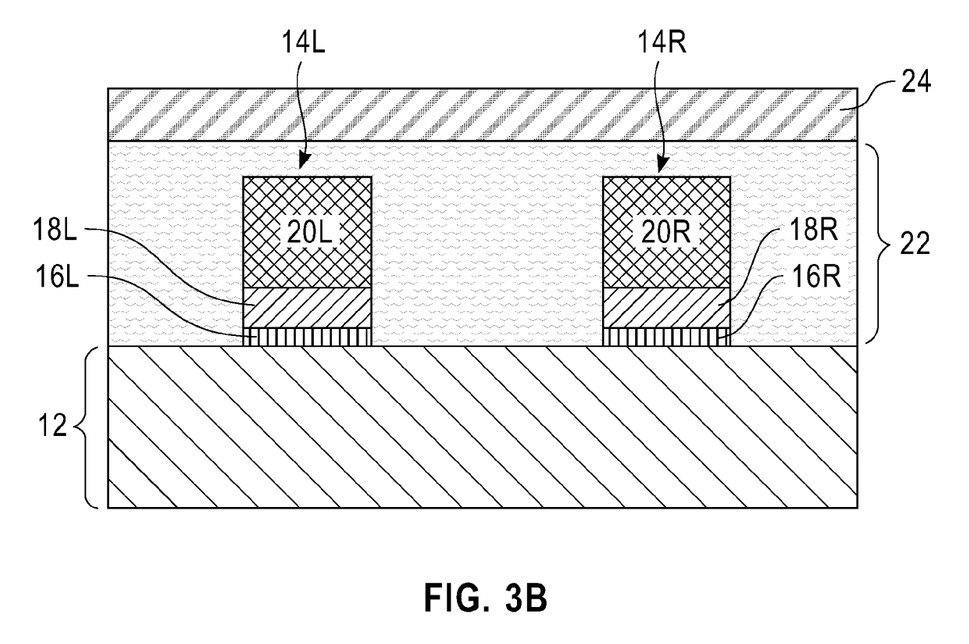
FIG. 3B is a cross sectional view of the structure along cut A-A' shown in FIG. 3A.
Figure 3C:
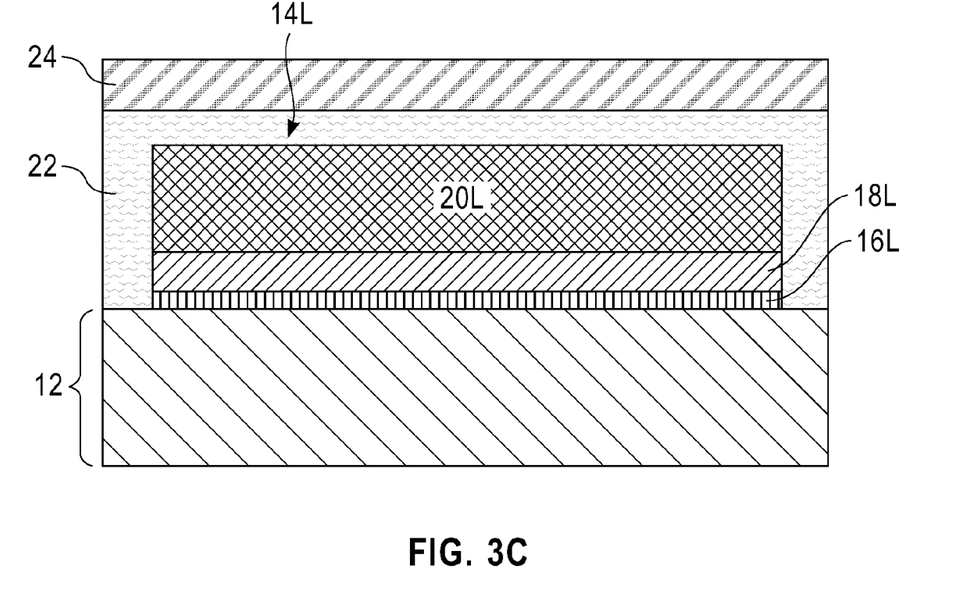
FIG. 3C is a cross sectional view of the structure along cut B-B' shown in FIG. 3A.

Referring now to FIGS. 3A, 3B and 3C, there are illustrated the structure of FIGS. 2A, 2B and 2C, respectfully, after forming a blanket layer of photoresist 24 atop the OPL 22. In some embodiments, an optional antireflective coating (not shown) can be formed between the OPL layer 22 and the photoresist 24.

When employed, the optional antireflective coating includes any inorganic or organic material that can control (i)

the reflection of light through an overlying photoresist material, and (ii) the reflection of light from material layers beneath the antireflective coating and back into the photoresist material that may interfere with incoming light and causes the photoresist material to be unevenly exposed. In general, the antireflective coating that can be optionally employed can be modeled so as to find optimum optical parameters (n and k values) of the antireflective coating as well as optimum thickness. In one embodiment, the optical constants of the antireflective coating are in the range from $n=1.2$ to $n=3.0$ and $k=0.01$ to $k=0.9$, more typically $n=1.4$ to $n=2.6$ and $k=0.02$ to $k=0.78$ at a wavelength of 365, 248, 193 and 157, 126 nm and extreme ultraviolet (13.4 nm) radiation. The optical properties and thickness of the antireflective coating are optimized to obtain optimal resolution, profile control and to maximize process window of the photoresist during a subsequent patterning steps, which is well known to those ordinarily skilled in the art.

Antireflective coatings that can be employed in the present disclosure include, for example, organic homopolymers or copolymers of polyesters, polyacrylates, polymethacrylates, polysulfones, and amorphous carbon. The antireflective coating may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. After applying the antireflective coating, particularly those from a liquid phase, a post deposition baking step is usually required to remove unwanted components, such as solvent, and to effect crosslinking. The post deposition baking step of the antireflective coating is typically, but not necessarily always, performed at a temperature from 80° C. to 300° C., with a baking temperature from 120° C. to 200° C. being more typical.

The photoresist 24 that can be employed in the present disclosure includes any conventional photoresist material including a positive-tone photoresist material or a negative-tone photoresist material. By "positive-tone" it is meant that the part of the photoresist that is exposed to photolithography will be removed by a conventional developer, while the unexposed part of the photoresist is not removed. By "negative-tone" it is meant that the part of the photoresist that is exposed to photolithography will not be removed by a conventional developer, while the unexposed part of the photoresist is removed. The photoresists may include photoacid generators, base additives and/or solvents, each of which is well known to those skilled in the art and, as such, details regarding those components are not fully provided.

The blanket layer of photoresist 24 is formed atop the surface of OPL 22 utilizing techniques well known to those skilled in the art including, for example, spin-on coating, dip coating, evaporation, chemical solution deposition, and chemical vapor deposition. After deposition, the blanket layer of photoresist 24 is typically dried and cured utilizing processing conditions that are well known to those skilled in the art.

Figure 4A:
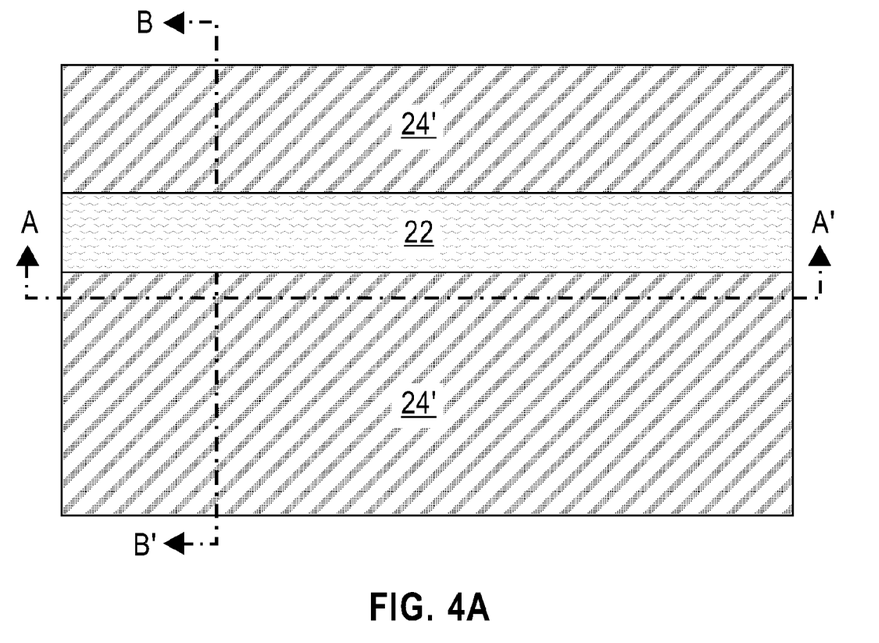
FIG. 4A is a pictorial representation (through a top-down view) illustrating the structure of FIG. 3A after patterning the photoresist to include at least one pattern therein.
Figure 4B:
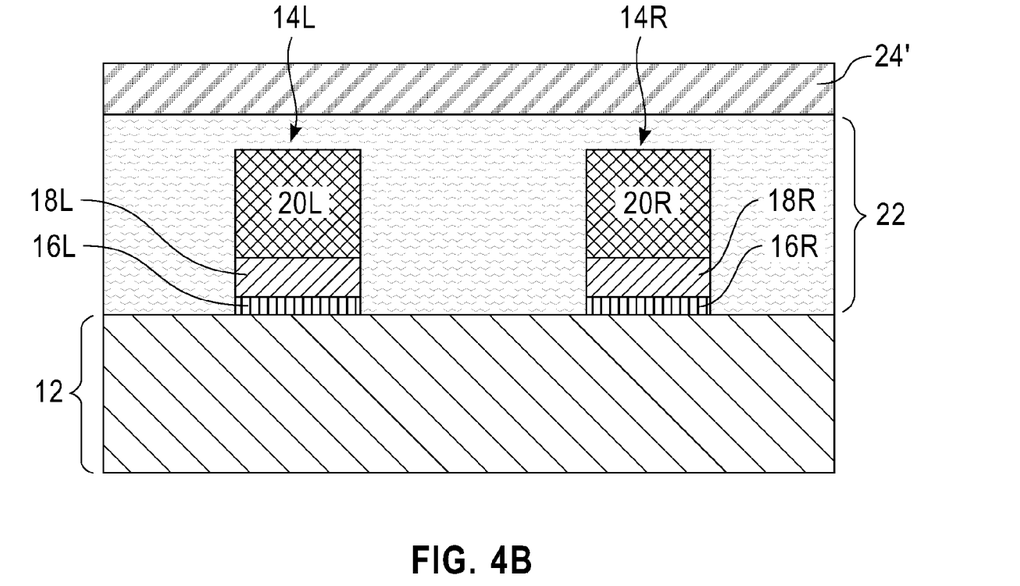
FIG. 4B is a cross sectional view of the structure along cut A-A' shown in FIG. 4A.
Figure 4C:
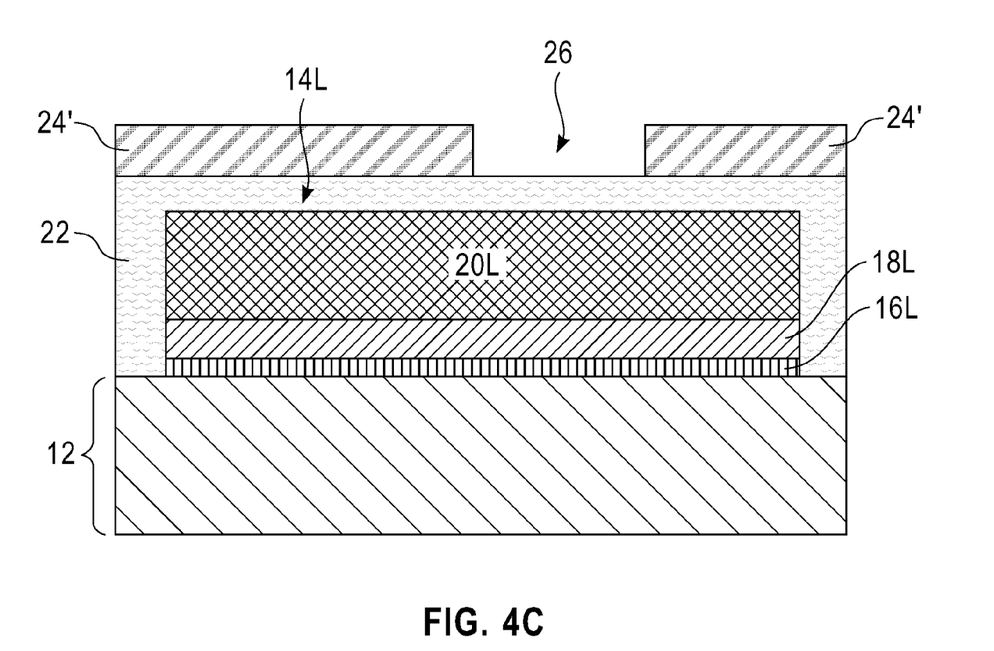
FIG. 4C is a cross sectional view of the structure along cut B-B' shown in FIG. 4A.

Referring now to FIGS. 4A, 4B and 4C, there are illustrated the structure of FIGS. 3A, 3B and 3C, respectively, after forming at least one pattern in the blanket layer of photoresist 24. The patterned photoresist is designated as 24' in the drawings. As shown (especially in FIG. 4C), the patterned photoresist 24' protects some portion of the OPL 22, while leaving other portions of the OPL 22 unprotected. The patterning of the blanket layer of photoresist 24 can be performed utilizing photolithography which includes exposing the blanket layer of photoresist 24 to a desired pattern of radiation and then removing portions of the exposed photoresist material utilizing a conventional developer so as to form the structure shown in FIGS. 4A, 4B, and 4C. As illustrated, the patterned photoresist 24 includes at least one pattern 26, i.e., opening, located therein. The at least one pattern 26 is formed perpendicular to each gate line 14L and 14R of the plurality of gate lines and the at least one pattern 26 crosses over each gate line 14L and 14R of the plurality of gate lines. As such, the at least one pattern 26 within the patterned photoresist 26' can be used in the present disclosure to cut each of the gate lines 14L and 14R into a plurality of gate stacks.

Figure 5A:
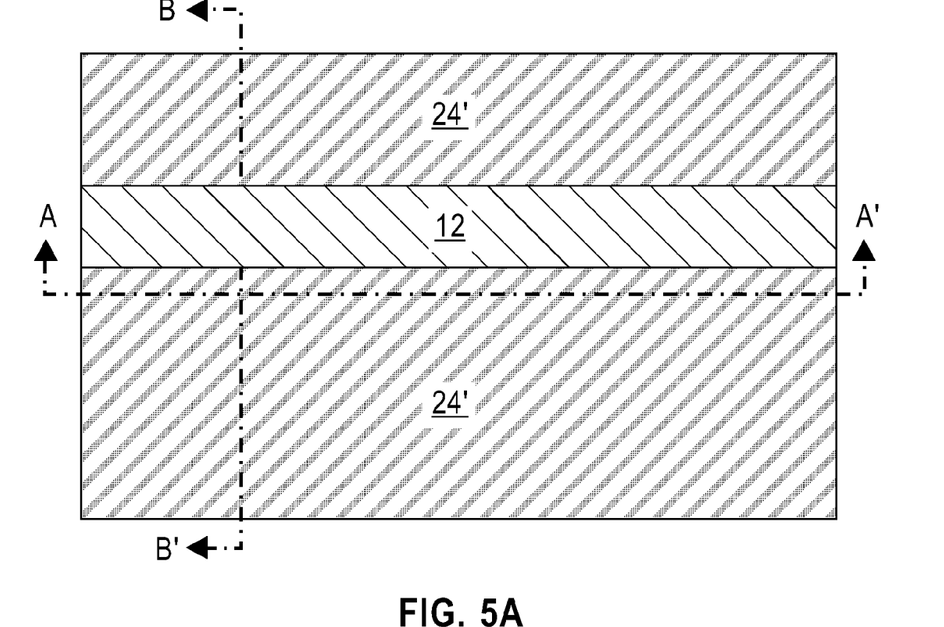
FIG. 5A is a pictorial representation (through a top-down view) illustrating the structure of FIG. 4A after transferring at least one pattern from the patterned photoresist into the organic planarizing layer and each of the gate lines of the plurality of gate lines.
Figure 5B:
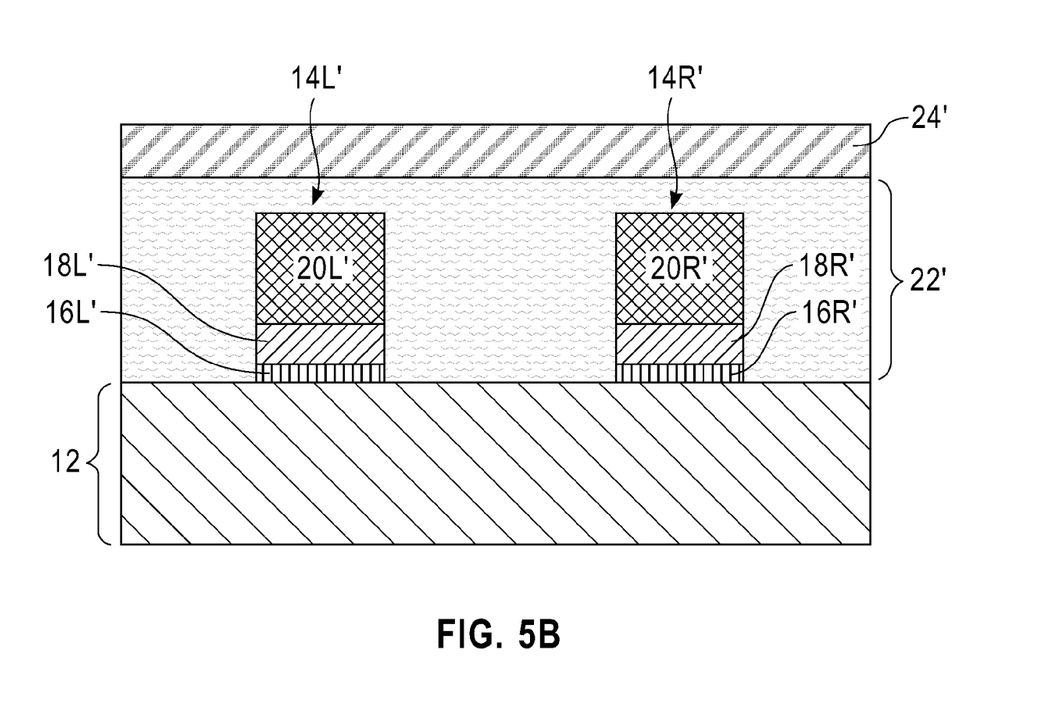
FIG. 5B is a cross sectional view of the structure along cut A-A' shown in FIG. 5A.
Figure 5C:
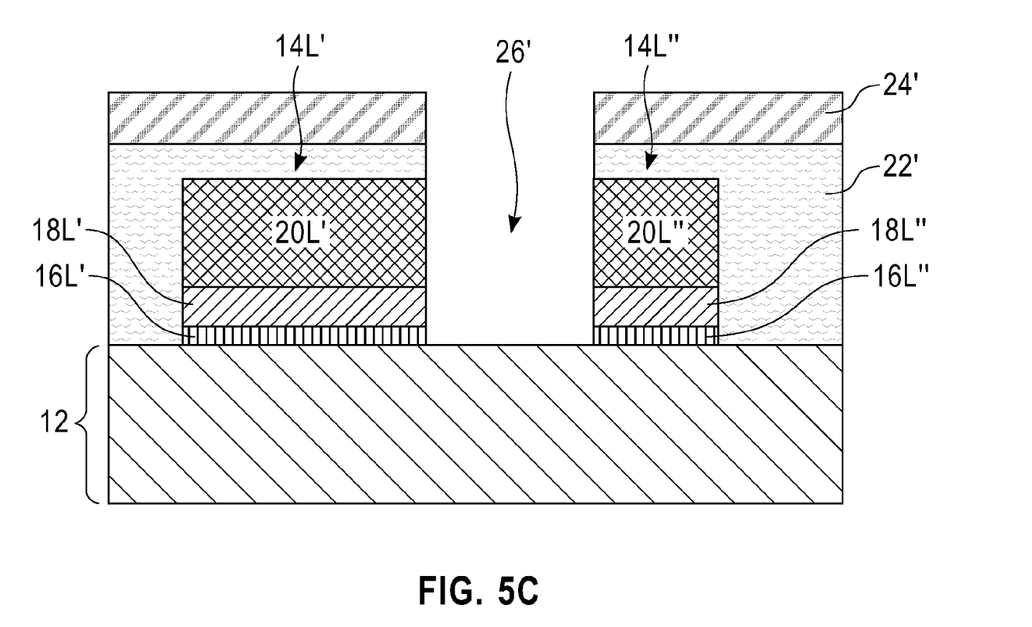
FIG. 5C is a cross sectional view of the structure along cut B-B' shown in FIG. 5A.

Referring now to FIGS. 5A, 5B and 5C, there are illustrated the structure of FIGS. 4A, 4B and 4C, respectively, after transferring the at least one pattern 26 through the OPL layer 22 and through each gate line 14L and 14R of the plurality of gate lines forming a plurality of metal gates 14L', 14L", 14R' and 14R". Metal gate stacks 14L" and 14R" are located behind gate stacks 14L' and 14R' illustrated in the cross sectional view in FIG. 5B. Each gate stack 14L', 14L", 14R' and 14R" includes a high k gate dielectric portion 16L', 16L", 16R', and 16R", a metal gate portion 18L', 18L", 18R', and 18R", and an optional Si-containing gate electrode portion 20L', 20L", 20R', and 20R". In FIG. 5C, the at least one pattern, i.e., opening, that is transferred from the patterned photoresist 24' to the OPL layer 22 and each gate line 14L and 14R of the plurality of gate lines is represented by element 26'. The patterned OPL is now designated as 22' in the drawings.

The transferring of least one pattern 26 located in the patterned photoresist 24' to the OPL layer 22 and each gate line 14L and 14R of the plurality of gate lines can be carried out using a dry etching process including, for example, reactive ion etching, ion beam etching, plasma etching, laser ablation and any combination thereof. In some embodiments, a single dry etch process can be used. In other embodiments, multiple dry etching processes can be used.

Figure 6A:
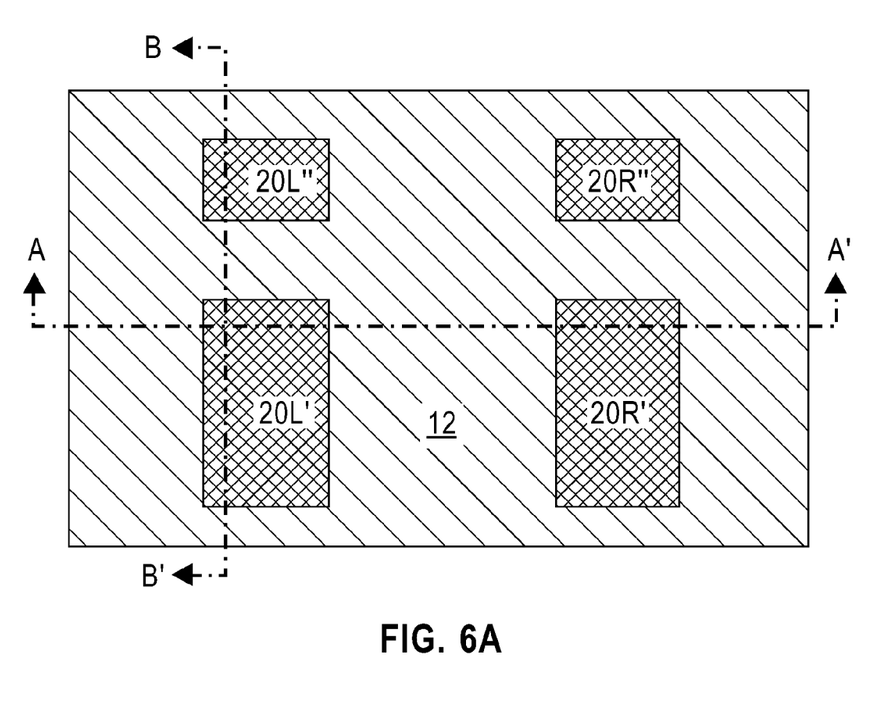
FIG. 6A is a pictorial representation (through a top-down view) illustrating the structure of FIG. 5A after removing the patterned photoresist and remaining portions of the organic planarizing layer from the structure which now includes a plurality of gate stacks located on a surface of the semiconductor substrate.
Figure 6B:
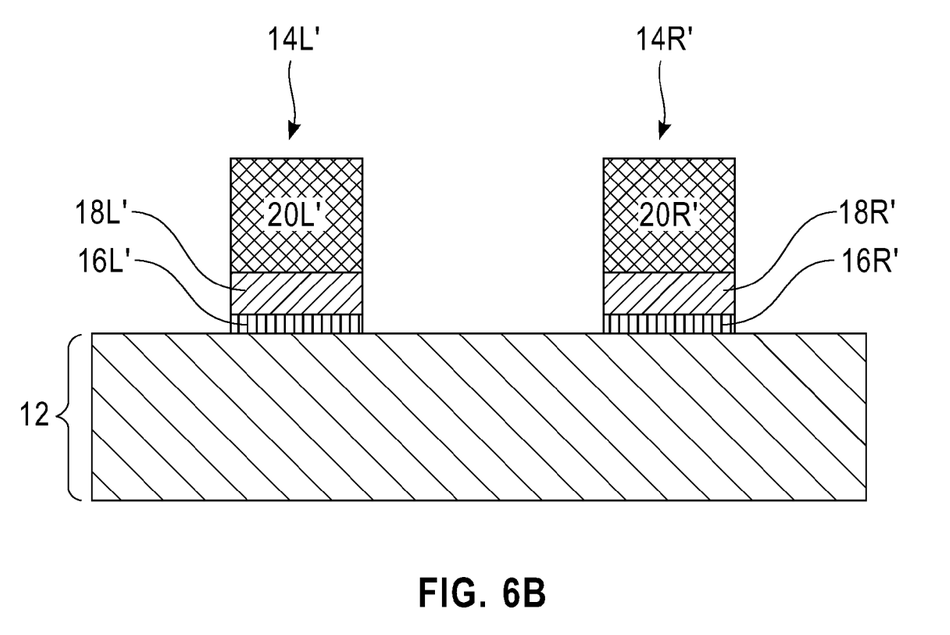
FIG. 6B is a cross sectional view of the structure along cut A-A' shown in FIG. 6A.
Figure 6C:
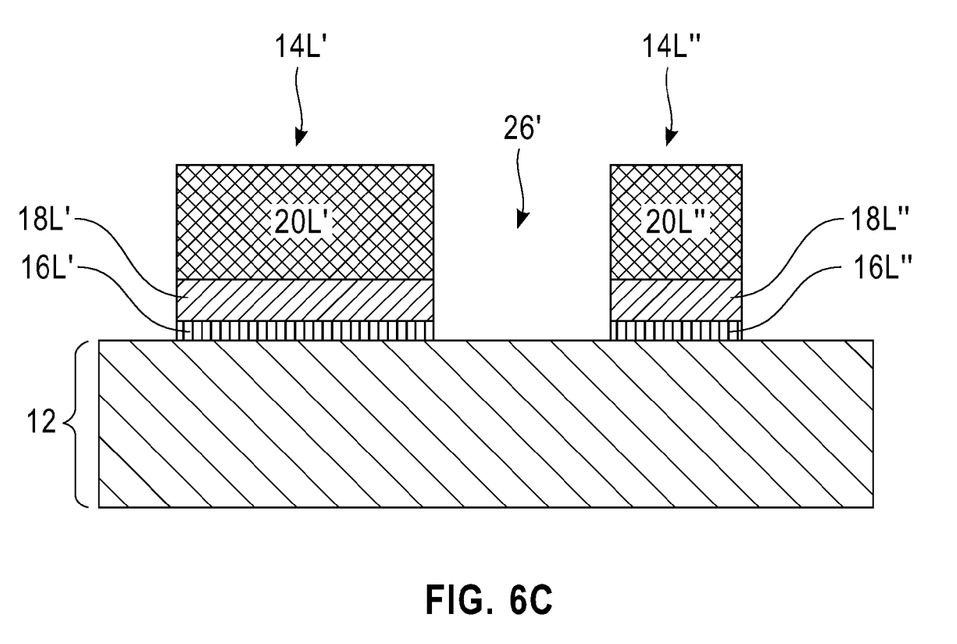
FIG. 6C is a cross sectional view of the structure along cut B-B' shown in FIG. 6A.

Referring now to FIGS. 6A, 6B and 6C, there are illustrated the structure of FIGS. 5A, 5B and 5C, respectively, after removing the patterned photoresist 24' and the remaining OPL, i.e., patterned OPL 22', from the structure. The removal of the patterned photoresist 24' and patterned OPL 22' includes (a) first contacting the structure with a first acid at a first temperature and for a first period of time, (b) second contacting the structure with an aqueous cerium-containing solution at a second temperature and for a second period of time, and (c) third contacting the structure with a second acid at a third temperature and for a third period of time. Contacting steps (b) and (c) can be repeated as deemed necessary. In one embodiment, contact step (b) and contact (c) can be repeated at least once. Typically contact steps (b) and (c) are repeated from 1 to 3 times.

As mentioned above, the first contacting including a first acid. The contacting with the first acid is believed to partially disrupt the organic planarizing layer. The first acid that can be employed in the present disclosure during the first contacting includes any acid that releases a proton, i.e., $H^+$ when added to water. Illustrative examples of such acids include, but are not limited to, hydrochloric acid (HCl), sulfuric acid ($H_2SO_4$), acetic acid, nitric acid ($HNO_3$), perchloric acid ($HClO_4$), phosphoric acid ($H_3PO_4$) and mixtures thereof. Typically, the first acid is sulfuric acid.

The first contacting with the first acid is performed at a first temperature which is typically from 15° C. to 150° C. More typically, the first contacting with the first acid is performed at a first temperature which is from 25° C. to 100° C. The first contacting with the first acid is typically performed for a first period time of from 1 minute to 60 minutes. More typically, the first contacting with the first acid is performed for a first period time of from 5 minutes to 30 minutes.

The second contacting is performed with an aqueous cerium-containing solution. The second contacting with the aqueous cerium-containing solution is believed to chemically react with the organic planarizing layer via attack on unsaturated carbon bonds, leading to subsequent removal of the patterned OPL 22' from the substrate.

While cerium is the active element employed in the aqueous solution, it is to be understood that elements with the same or similar chemical characteristics as cerium could be used. For example, other Lanthanoid elements may have some characteristics similar to cerium and thus could be used. Lanthanoid elements are generally known to be those elements with atomic numbers 57 through 71, i.e., lanthanum, cerium, praseodymium, neodymium, promethium, samarium, europium, gadolinium, terbium, dysprosium, holmium, erbium, thulium, ytterbium, and lutetium. In addition, certain non-Lanthanoid elements may have chemical characteristics similar to cerium and thus could be used. Such elements may include, but not be limited to, cobalt, nickel, manganese, iron, vanadium, titanium, ruthenium, rhodium and molybdenum.

The aqueous cerium-containing solution used in the second contacting of the present disclosure comprises at least one cerium (IV) complex or salt. In one embodiment, the at least one cerium (IV) complex or salt can be, for example, cerium ammonium nitrate. The chemical formula of cerium ammonium nitrate may be expressed as $Ce(NH_4)_2(NO_3)_6$ or $(NH_4)_2Ce(NO_3)_6$. Cerium ammonium nitrate is also known as CAN, cerium (IV) ammonium nitrate, ceric ammonium nitrate and ammonium cerium nitrate. CAN is an orange, water-soluble salt that may be used as an oxidizing agent.

Other cerium (IV) complexes or salts that may be used include, but are not limited to, ceric nitrate, ceric ammonium sulfate, ceric sulfate, ceric bisulfate, ceric perchlorate, ceric methanesulfonate, ceric trifluoromethanesulfonate, ceric chloride, ceric hydroxide, and ceric acetate. These cerium (IV) complexes or salts can be used in place of or in conjunction with CAN. In some embodiments of the present disclosure, the solution may comprise more than one of the above cerium (IV) complexes or salts. In some embodiments, the cerium (IV) complex or salt preferably comprises cerium ammonium nitrate.

Since ceric solutions in water tend to hydrolyze and generate precipitates over time, especially when kept above ambient temperature (i.e., above about 20° C. to 25° C.), at least one stabilizer may be employed in order to stabilize the solution. Stated in other terms, ceric (IV) complexes or salts in water are generally stable, but at elevated temperatures around 70° C., ceric (IV) complexes or salts generate precipitate due to hydrolysis and/or redox reactions. However, in strongly acidic solutions such precipitates are soluble. By "strongly acid" it is meant a pH of less than 1. For this reason, the cerium-containing solution is typically formulated in an acidic media in order to stabilize the solution and prevent or limit precipitation of the cerium. The acidic media, which can be provided for by at least one stabilizer, acts to reduce precipitation, for example, by dissolving precipitant from the solution. The at least one stabilizer may be referred to as a bath stabilizer.

In one embodiment, the at least one stabilizer is an ammonium salt. The ammonium salt is in addition to the ammonium compound in CAN or any other ammonium compound of cerium that can be employed as the cerium (IV) salt. Ammonium salts that can be used as a stabilizer include, but are not limited to, at least one of ammonium chloride, ammonium nitrate, ammonium sulfate $(NH_4)_2SO_4$, ammonium bisulfate, ammonium acetate, ammonium perchlorate $(NH_4ClO_4)$, ammonium trifluoroacetate, ammonium methanesulfonate, and ammonium trifluoromethane sulfonate.

Other compounds that are stabilizers and which can be employed in the aqueous solution of the present disclosure include, but are not limited to, acids. Acids that can be employed as a stabilizer agent include, but are not limited to, one or more of nitric acid, hydrochloric acid, sulfuric acid, perchloric acid, glacial acetic acid, methanesulfonic acid, trifluoromethanesulfonic acid, and polysulfonic acid (e.g., poly(4-styrenesulfonic acid). Alternatively, or in addition to, other water soluble acidic polymers may be added including, but not limited to, polyacrylic acid, polymethacrylic acid, and polymeric acid. Examples of polymeric acids include, but are not limited to, polymaleic acid, polytetrafluorosulfonic acid, poly(ethylene-maleic) acid and polystyrene carboxylic acid.

In one embodiment, the effective range of concentrations for the stabilizer that can be present in the aqueous cerium-containing solution is from 0.5% to 15% by weight, based on the total weight of the aqueous cerium-containing solution. In another embodiment, the effective range of concentrations for the stabilizer that can be present in the aqueous cerium-containing solution is from 0.5% to 10% by weight, based on the total weight of the aqueous cerium-containing solution.

In addition to the above, the aqueous cerium-containing solution includes water such as deionized water (DI water) as a solvent. In one embodiment, the aqueous cerium-containing solution includes from 1 wt % to 50 wt % cerium (IV) complex or salt and from 50 wt % to 99 wt % water, based on the total weight of the aqueous solution. In another embodiment, aqueous cerium-containing solution includes from 10 wt % to 40 wt % cerium (IV) complex or salt and from 60 wt % to 90 wt % water, based on the total weight of the aqueous solution. In yet another embodiment, the aqueous cerium-containing solution includes from 15 wt % to 35 wt % cerium (IV) complex or salt and from 65 wt % to 85 wt % water, based on the total weight of the aqueous cerium-containing solution. In an even further embodiment, the aqueous cerium-containing solution includes from 20 wt % to 30 wt % cerium (IV) complex or salt and from 70 wt % to 80 wt % water, based on the total weight of the aqueous cerium-containing solution.

Embodiments of the cerium-containing aqueous solution of the present disclosure include, but are not limited to, (i) a solution comprising, consisting of, or consisting essentially of, cerium (IV) complex or salt, and water, (ii) a solution comprising, consisting of, or consisting essentially of, cerium (IV) complex or salt, water, and an ammonium salt, (iii) a solution comprising, consisting of, or consisting essentially of, cerium (IV) complex or salt, water, and an acid, or (iv) a solution comprising, consisting of, or consisting essentially of, cerium (IV) complex or salt, water, an ammonium salt, and an acid.

The second contacting with the aqueous cerium-containing solution is performed at a second temperature which is typically from 25° C. to 150° C. More typically, the second contacting with the aqueous cerium-containing solution is performed at a second temperature which is from 50° C. to 100° C. The second contacting with the aqueous cerium-containing solution is typically performed for a second period time of from 1 minute to 60 minutes. More typically, the second contacting with the aqueous cerium-containing solution is performed for a second period time of from 5 minutes to 30 minutes.

After the second contacting with the aqueous cerium-containing solution, a third contacting with a second acid is performed. The second acid used in the third contacting may be the same or different, typically the same, as the first acid of the first contacting. The contacting with the second acid is believed to further remove the patterned organic material. The second acid that can be employed in the present disclosure during the third contacting includes any acid that releases a proton, i.e., $H^+$ when added to water. Illustrative examples of such acids include, but ate not limited to, hydrochloric acid (HCl), sulfuric acid ($H_2SO_4$), acetic acid, nitric acid ($HNO_3$), perchloric acid ($HClO_4$), phosphoric acid ($H_3PO_4$) and mixtures thereof. Typically, the second acid is sulfuric acid.

The third contacting with the second acid is performed at a third temperature which is typically from 25° C. to 150° C. More typically, the third contacting with the second acid is performed at a third temperature which is from 50° C. to 100° C. The third contacting with the second acid is typically performed for a third period time of from 1 minute to 60 minutes. More typically, the third contacting with the second acid is performed for a third period time of from 5 minutes to 30 minutes.

Each of the above mentioned contacting steps may include immersion of the structure in a bath including a specific material, i.e., first acid, aqueous cerium-containing solution or second acid. Other methods of contact are also contemplated, for example, spraying, rinsing or washing the structure and agitating the structure in the specific material, i.e., first acid, aqueous cerium-containing solution or second acid. The first contacting, second contacting and third contacting may include any of the above methods.

Figure 7:
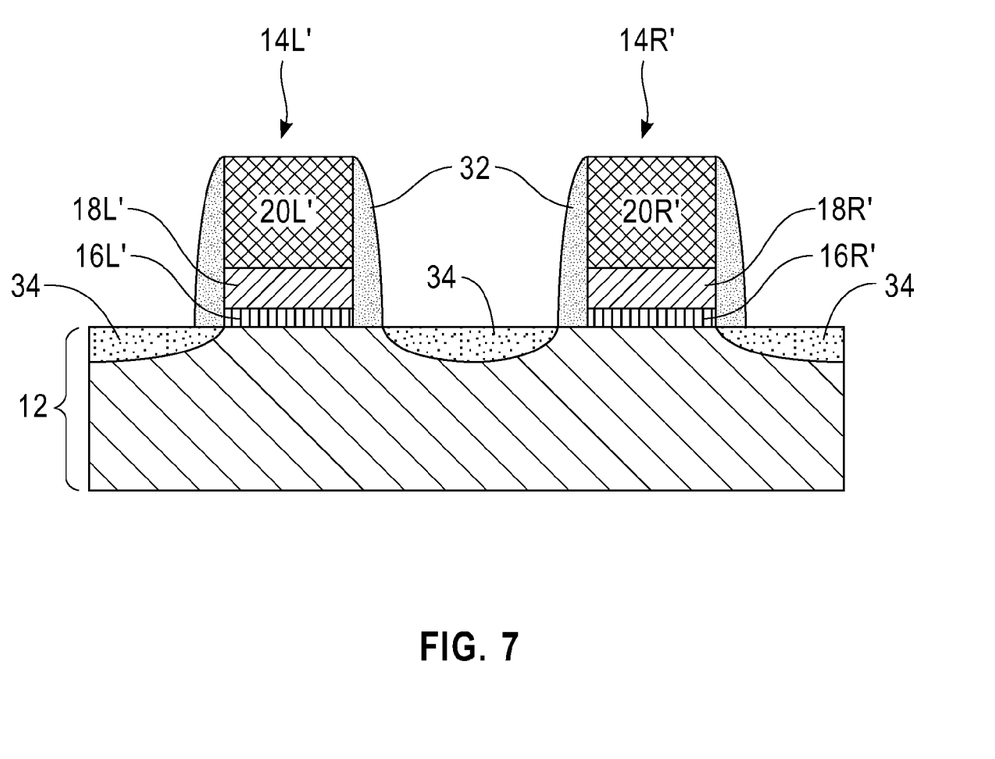
FIG. 7 is a pictorial representation of the structure of FIG. 6B (through the same cut A-A' after forming at least one spacer and a source region and a drain region.

Referring now to FIG. 7, there is illustrated the structure of FIG. 6B are forming at least one spacer 32 on exposed sidewalls of each gate stack 14L', 14L", 14R' and 14R" that is formed. It is noted that the gate structures 14L" and 14R" are positioned behind gate stacks 14L' and 14R', respectively in the drawing. In some embodiments, the at least one spacer 32 can be omitted from the sidewalls of each gate stack 14L', 14L", 14R' and 14R". When present, the at least one spacer 32 can be comprised of an oxygen impermeable dielectric material such as, for example, silicon oxide, silicon nitride and/or silicon oxynitride. The at least one spacer 32 can be formed by deposition of an oxygen impermeable dielectric material and then etching. In some embodiments, a thermal process can be used in forming the at least one spacer 32.

Each gate stack 14L', 14L", 14R' and 14R" also includes a source region and a drain region (collectively referred to herein as source/drain regions 34. In the drawings, the middle source/drain region between the gate stack 14L' and 14R' is shown as being a common source/drain region. Although such an embodiment is shown, the source/drain region 34 positioned between the gate stack 14L' and 14R' may be separate source/drain regions. The source/drain regions 34 are typically formed in the substrate 10 and at the footprint of each gate stack 14L', 14L", 14R' and 14R" utilizing ion implantation and annealing. The conditions and dopants for the ion implantation process are well known to those skilled in the art. The anneal, which activates the dopants that are ion implanted into the semiconductor substrate 12, includes heating at a temperature of about 800° C. or above. The portion of the semiconductor substrate 12 that is located beneath each gate stack 14L', 14L", 14R' and 14R" and laterally bounded by the source/drain regions 32 is a channel region of the transistor.

It is noted that in each gate stack 14L', 14L", 14R' and 14R" the high gate dielectric portions, the metal gate portions and the Si-containing gate electrode portions each have sidewalls that are vertically coincident to each other.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A process for forming a semiconductor structure comprising:
   forming a plurality of gate lines on a surface of a semiconductor substrate, wherein each gate line of said plurality of gate lines includes at least a high k gate dielectric and an overlying metal gate;
   forming an organic planarizing layer (OPL) atop the semiconductor substrate and the plurality of gate lines;
   forming a patterned photoresist including at least one pattern atop the OPL, said at least one pattern is located atop a portion of each gate line of the plurality of gate lines;
   transferring the at least one pattern into the underlying OPL and gate line by etching; and
   removing the patterned photoresist and remaining OPL layer by a sequence of contacting steps comprising (a) first contacting with a first acid at a first temperature and for a first period of time, (b) second contacting with an aqueous cerium-containing solution at a second temperature and for a second period of time, and (c) third contacting with a second acid at a third temperature and for a third period of time.

2. The process of claim 1, wherein contacting steps (b) and (c) are repeated at least once.

3. The process of claim 1, wherein said OPL is selected from the group consisting of a near frictionless carbon material, and a polyimide.

4. The process of claim 1, wherein said first acid is sulfuric acid.

5. The process of claim 1, wherein said first temperature is from 15° C. to 150° C. and said first period of time is from 1 minute to 60 minutes.

6. The process of claim 1, wherein said aqueous cerium-containing solution comprises a cerium (IV) containing complex or salt and water.

7. The process of claim 6, wherein said cerium (IV) containing complex or salt is at least one of ceric ammonium nitrate, ceric nitrate, ceric ammonium sulfate, ceric sulfate, ceric bisulfate, ceric perchlorate, ceric methanesulfonate, ceric trifluoromethansulfonate, ceric chloride, ceric hydroxide and ceric actetate.

8. The process of claim 6, wherein said aqueous cerium-containing solution further comprises at least one ammonium salt as a stabilizer.

9. The process of claim 8, wherein said at least one ammonium salt comprises ammonium chloride, ammonium nitrate, ammonium sulfate ($(NH_4)_2SO_4$, ammonium bisulfate, ammonium acetate, ammonium perchlorate ($NH_4ClO_4$), ammonium trifluoroacetate, ammonium methanesulfonate, or ammonium trifluoromethane sulfonate.

10. The process of claim 6, wherein said aqueous cerium-containing solution further comprises at least one acid as a stabilizer.

11. The process of claim 10, wherein said at least one acid comprises nitric acid, hydrochloric acid, sulfuric acid, perchloric acid, glacial acetic acid, methanesulfonic acid, trifluoromethanesulfonic acid, polysulfonic acid, polyacrylic acid, polymethacrylic acid, polymaleic acid, polytetrafluorosulfonic acid, poly(ethylene-maleic) acid or polystyrene carboxylic acid.

12. The process of claim 6, wherein said cerium (IV) containing complex or salt is ceric ammonium nitrate and said aqueous cerium-containing solution further comprises ammonium trifluoroacetate as a stabilizer.

13. The process of claim 1, wherein said second temperature is from 25° C. to 150° C. and said second period of time is from 1 minute to 60 minutes.

14. The process of claim 1, wherein said second acid is sulfuric acid.

15. The process of claim 1, wherein said third temperature is from 25° C. to 150° C. and said third period of time is from 1 minute to 60 minutes.

16. The process of claim 1, wherein said first and second acids comprise a same or different acid selected from the group consisting of sulfuric acid, hydrochloric acid, acetic acid, nitric acid, perchloric acid, phosphoric acid and mixtures thereof.

17. The process of claim 1, wherein said metal gate includes an elemental metal, an alloy of at least two elemental metals, an elemental metal nitride, an elemental metal silicide or multilayers thereof.

18. The process of claim 1, wherein said metal gate is comprised of TiN.

19. The process of claim 1, wherein each gate line of said plurality of gate lines includes a Si-containing gate electrode located atop the metal gate.

20. The process of claim 1, wherein after removing the patterned photoresist and the remaining OPL each gate line of the plurality of gate lines is cut into a plurality of gate stacks, where each gate stack of said plurality of gate stacks has a metal gate portion that has sidewalls that are vertical coincident to sidewalls of an underlying high k gate dielectric portion.

21. The process of claim 20, further comprising forming at least one spacer on each gate stack of said plurality of gate stacks and forming a source region and a drain region in the semiconductor substrate and at a footprint of each gate stack of said plurality of gate stacks.

22. The process of claim 1, wherein said organic planarizing layer (OPL) is in direct contact with each gate line of the plurality of gate lines.

23. The process of claim 1, wherein said first and second acids each comprise sulfuric acid, and said aqueous cerium-containing solution comprises a mixture of ceric ammonium nitrate, ammonium trifluoroacetate and water.

* * * * *